United States Patent
Rossini

(10) Patent No.: US 11,373,978 B2
(45) Date of Patent: Jun. 28, 2022

(54) SEMICONDUCTOR CHIP HAVING A PLURALITY OF LED FOR IMAGE DISPLAY

(71) Applicant: Commissariat à l'Energie Atomique et aux Energies Alternatives, Paris (FR)

(72) Inventor: Umberto Rossini, Coublevie (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 427 days.

(21) Appl. No.: 16/499,289

(22) PCT Filed: Apr. 4, 2018

(86) PCT No.: PCT/FR2018/050844
§ 371 (c)(1),
(2) Date: Sep. 29, 2019

(87) PCT Pub. No.: WO2018/185434
PCT Pub. Date: Oct. 11, 2018

(65) Prior Publication Data
US 2021/0111157 A1    Apr. 15, 2021

(30) Foreign Application Priority Data

Apr. 5, 2017  (FR) ...................... 1752955

(51) Int. Cl.
*H01L 25/065*   (2006.01)
*G09G 3/32*     (2016.01)
(Continued)

(52) U.S. Cl.
CPC .......... *H01L 25/0655* (2013.01); *G09G 3/32* (2013.01); *H05K 3/125* (2013.01); *H05K 3/1216* (2013.01);
(Continued)

(58) Field of Classification Search
CPC .................................................. H01L 25/0655
(Continued)

(56) References Cited

U.S. PATENT DOCUMENTS 9,084,326 B2    7/2015  Guan et al.
2005/0128767 A1  6/2005  Wang et al.
(Continued)

FOREIGN PATENT DOCUMENTS

WO    2008074800 A1    6/2008
WO    2017053477 A1    3/2017

OTHER PUBLICATIONS

International Preliminary Search Report for International Application No. PCT/FR2018/050842 dated May 25, 2018, 3 pages.
(Continued)

*Primary Examiner* — Long D Pham
(74) *Attorney, Agent, or Firm* — Moreno IP Law LLC

(57) ABSTRACT

The invention concerns a display device including a transfer substrate (1010) including electric connection elements (L1, L2, C1, C2, P1, P2, P3, P4), and a plurality of semiconductor chips, wherein the transfer substrate (1010) includes an insulating plate, the electric connection elements of the substrate being formed by printing, on a surface of said plate, of a first conductive level, followed by an insulating level, followed by a second conductive level, the electric connection elements of the substrate including: a plurality of first conductive tracks (L1, L2) formed in the first conductive level; a plurality of second conductive tracks (C1, C2) formed in the second conductive level; and for each chip of the device, a plurality of electric connection areas (P1, P2, P3, P4) respectively connected to connection terminals of the chip, said areas being all formed in the second conductive level.

12 Claims, 6 Drawing Sheets

(51) Int. Cl.
H05K 3/12 (2006.01)
H05K 3/46 (2006.01)

(52) U.S. Cl.
CPC ........... *H05K 3/465* (2013.01); *H05K 3/4664* (2013.01); *G09G 2310/0297* (2013.01)

(58) Field of Classification Search
USPC ......................................................... 345/214
See application file for complete search history.

(56) References Cited

U.S. PATENT DOCUMENTS

| | | | |
|---|---|---|---|
| 2007/0262948 A1* | 11/2007 | Han | G09G 3/3406 345/102 |
| 2012/0080692 A1 | 4/2012 | Ohtorii | |
| 2015/0310805 A1* | 10/2015 | Hyeon | G09G 3/3233 345/76 |
| 2016/0258588 A1 | 9/2016 | Grotsch et al. | |
| 2017/0061867 A1 | 3/2017 | Cok et al. | |
| 2017/0150582 A1 | 5/2017 | Clout et al. | |

OTHER PUBLICATIONS

C.A. Bower et al., "Emissive displays with transfer-printed assemblies of 8 μm×15 μm inorganic light-emitting diodes," Photonics Research, vol. 5, No. 2, Feb. 23, 2017, pp. A23-A29.

H.J. Chung et al., "Fabrication of Releasable Single-Crystal Silicon-Metal Oxide Field-Effect Devices and Their Deterministic Assembly on Foreign Substrates," Adv. Funct. Mater., vol. 21, No. 16, Aug. 23, 2011, pp. 3029-3036.

C.A. Bower et al., "Active-Matrix OLED Display Backplanes Using Transfer-Printed Microscale Integrated Circuits," IEEE 2010 Electronic Components and Technology Conference, pp. 1339-1343.

International Preliminary Search Report for International Application No. PCT/FR2018/050844 dated Jun. 13, 2018, 2 pages.

Translation of Written Opinion of the International Searching Authority for International Application No. PCT/FR2018/050842 dated Jun. 1, 2018 5 pages.

Translation of Written Opinion of the International Searching Authority for International Application No. PCT/FR2018/050844 dated Jun. 26, 2018 5 pages.

* cited by examiner

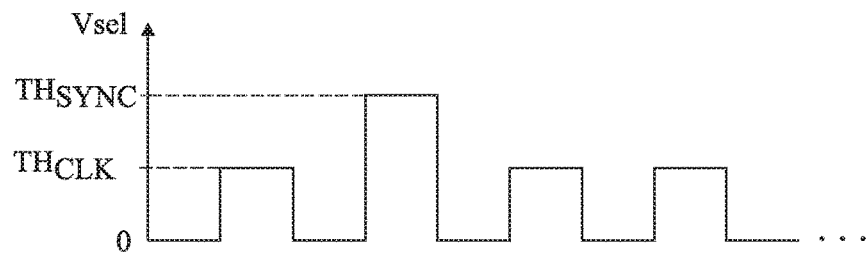
Fig 7
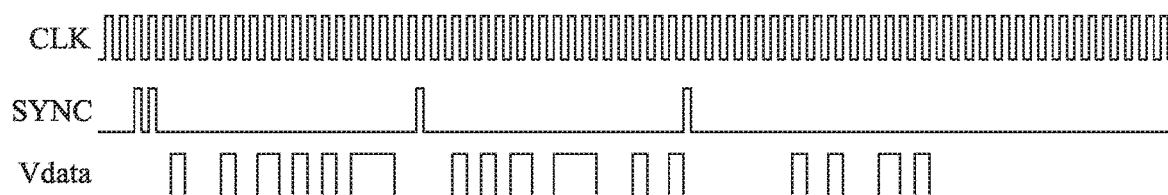
Fig 8
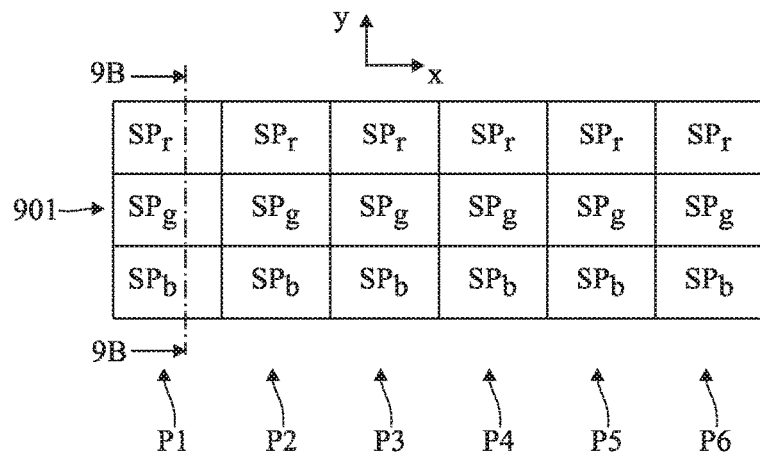 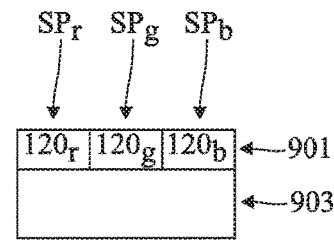
Fig 9A      Fig 9B
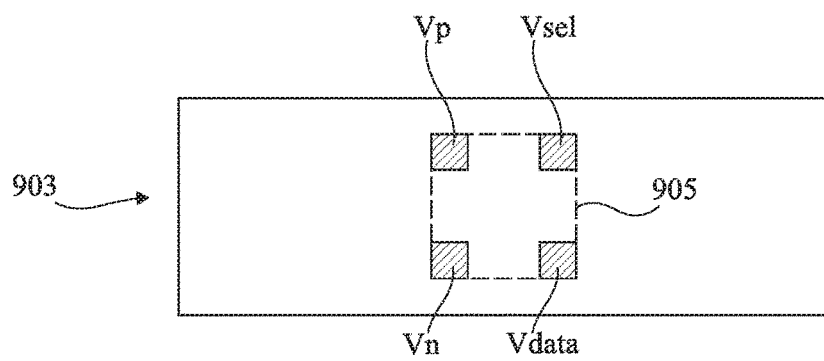
Fig 9C

SEMICONDUCTOR CHIP HAVING A PLURALITY OF LED FOR IMAGE DISPLAY

The instant application is related to application Ser. No. 16/499,288 entitled "LED EMISSIVE IMAGE DISPLAY DEVICE", filed on even date herewith.

FIELD

The present application concerns the forming of an emissive image display device comprising light-emitting diodes (LEDs), for example, a screen for a television, a computer, a smart phone, a tablet, etc.

BACKGROUND

An image display device comprising a plurality of elementary electronic chips arranged in an array on a same transfer substrate has already been provided in French patent application Nr. 1561421 filed on Nov. 26, 2015. The chips are assembled to be fastened to the transfer substrate and connected to elements of electronic connection of the transfer substrate for the control thereof. Each chip comprises a stack of a LED and of a LED control circuit and corresponds to a pixel of the device.

It would be desirable to be able to at least partly improve certain aspects of an image display device of this type.

SUMMARY

Thus, an embodiment provides an emissive display device comprising:

a transfer substrate comprising electric connection elements; and a plurality of semiconductor chips fastened to the substrate and connected to the elements of electric connection of the substrate for the control thereof, each chip comprising:

at least one LED;

a plurality of terminals of connection to the substrate; and a control circuit based on transistors capable of applying to said at least one LED a bias signal according to signals received on the terminals of connection of the chip to the substrate, wherein the transfer substrate comprises an insulating plate, the electric connection elements of the substrate being formed by printing, on a surface of said plate, of a first conductive level, followed by an insulating level, followed by a second conductive level, the elements of electric connection of the substrate comprising:

a plurality of first conductive tracks formed in the first conductive level;

a plurality of second conductive tracks formed in the second conductive level; and for each chip of the device, a plurality of electric connection areas respectively connected to the connection terminals of the chip, said areas being all formed in the second conductive level.

According to an embodiment, the first conductive tracks are substantially parallel and the second conductive tracks are substantially orthogonal to the first tracks.

According to an embodiment, in each elementary chip of the device, said at least one LED of the chip is formed in a first substrate based on a III-V semiconductor, and the chip control circuit is formed in a second substrate based on silicon, adjacent and electrically connected to the first substrate.

According to an embodiment, in each elementary chip, the connection terminals of the chip are formed on the side of the surface of the second substrate opposite to the first substrate.

According to an embodiment, each elementary chip is arranged so that the surface of its second substrate opposite to the first substrate faces the transfer substrate to form direct electric connections between the connection terminals of the chip and the electric connection areas of the transfer substrate.

According to an embodiment, for each chip of the device, the transfer substrate comprises at least one electric connection area connected to a first conductive track of the transfer substrate, and at least one electric connection area connected to a second conductive track of the transfer substrate.

According to an embodiment, each elementary chip comprises a first terminal of connection to the substrate intended to receive a signal for setting said at least one LED of the chip.

According to an embodiment, each elementary chip further comprises a second terminal of connection to the substrate intended to receive a selection and/or synchronization signal.

According to an embodiment, each elementary chip further comprises third and fourth terminals of connection to the substrate intended to respectively receive a high power supply potential and a low power supply potential of the chip.

According to an embodiment, each elementary chip comprises a plurality of LEDs, and the first connection terminal of the chip is intended to receive, for each LED of the chip, an individual signal for setting the LED, the individual signals for setting the different LEDs of the chip being temporally multiplexed on said first terminal.

According to an embodiment, in each elementary chip, the chip control circuit is capable of demultiplexing the signals received on said first terminal and of applying to each LED of the chip a bias signal which is a function of the individual LED setting signal received on said first terminal.

BRIEF DESCRIPTION OF THE DRAWINGS

The foregoing and other features and advantages will be discussed in detail in the following non-limiting description of specific embodiments in connection with the accompanying drawings, in which:

FIGS. 7 and 8 are timing diagrams illustrating an example of an operating mode of the elementary chip of FIG. 6;

FIGS. 9A, 9B, 9C are respective simplified top, cross-section, and bottom views of an example of an elementary chip of an image display device according to an embodiment.

DETAILED DESCRIPTION OF THE PRESENT EMBODIMENTS

Figure 1:
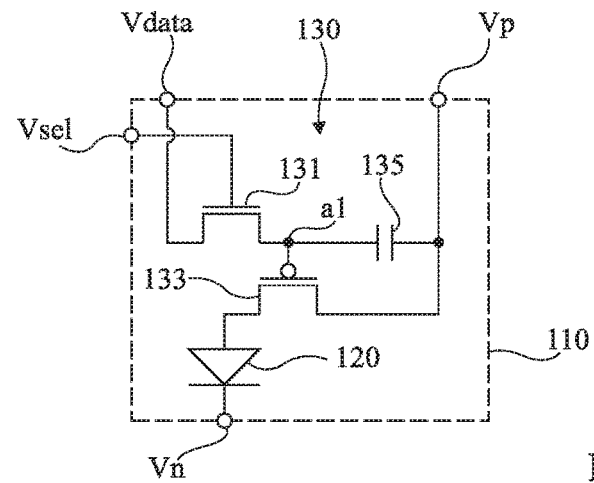
FIG. 1 is an electric diagram of the circuits of an elementary chip of an example of an image display device.

The same elements have been designated with the same reference numerals in the various drawings and, further, the various drawings are not to scale. For clarity, only those steps and elements which are useful to the understanding of the described embodiments have been shown and are detailed. In particular, the manufacturing of the elementary chips of the described display devices has not been detailed, the manufacturing of such chips being within the abilities of those skilled in the art based on the teachings of the present disclosure. As an example, the elementary chips of the described display devices, each comprising one or a plurality of LEDs and a control circuit based on transistors, may be manufactured according to methods identical or similar to those described in above-mentioned French patent application Nr. 1561421, which is herein incorporated by reference as authorized by law. In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described devices may be oriented differently. Unless otherwise specified, expressions "approximately", "substantially", and "in the order of" mean to within 10%, preferably to within 5%, or, relating to angular values or to angular directions, to within 10 degrees, preferably to within 5 degrees.

FIG. 1 is an electric diagram of the circuits of an elementary chip 110 of an image display device of the type described in above-mentioned French patent application Nr. 1561421.

Chip 110 comprises a LED 120, preferably an inorganic LED, for example, a LED based on gallium nitride or on any other III-V semiconductor capable of forming a LED. Chip 110 further comprises an active circuit 130 for controlling LED 120, for example, a circuit based on transistors, capable of controlling the emission of light by the LED.

As an example, control circuit 130 and LED 120 are first formed separately, respectively inside and on top of a silicon substrate for circuit 130, and on an adapted growth substrate, for example, made of sapphire, for LED 120. LED 120 is formed to have electric anode and cathode contacts on the side of its surface opposite to the growth substrate. Control circuit 130 comprises, on the side of a first surface of the silicon substrate, electric connection areas intended to be placed in contact with the anode and cathode contacts of the LED and, on the side of a second surface of the silicon substrate opposite to the first surface, terminals of connection to an outer device for the chip control. Circuit 130 and LED 120 are then fastened by bonding of the surface of the LED opposite to the growth substrate to the first surface of circuit 130. The chip comprising circuit 130 and LED 120 is then transferred onto a transfer substrate, for example, a passive transfer substrate, comprising electric connection elements for the power supply and the control of the chip. During the transfer, the chip is arranged so that the second surface of circuit 130 of the chip faces the transfer substrate, to form direct electric connections between the connection terminals outside of the chip and electric connection areas of the transfer substrate. The growth substrate may further be removed before or after the bonding of the chip to the transfer substrate.

In this example, chip 110 comprises four terminals of connection to the outside Vp, Vn, Vsel, and Vdata. For simplification, in the present disclosure, the electric signals applied to the chip connection terminals are designated with same references as the actual terminals. Terminals Vp and Vn are intended to respectively receive a low power supply potential Vp (for example, the ground) and a high power supply potential (that is, greater than the low power supply potential) Vn of the chip. Terminals Vsel and Vdata are intended to receive chip control signals. More particularly, signal Vsel is a chip selection signal, and signal Vdata is a signal for setting the brightness level of the chip.

In the example of FIG. 1, chip control circuit 130 comprises two transistors 131 and 133 and one capacitive element 135, for example, a capacitor. In this example, transistors 131 and 133 are MOS transistors. More particularly, transistor 131 is an N-channel MOS transistor and transistor 133 is a P-channel MOS transistor. Transistor 131 has a first conduction node (the source or the drain in the present example) connected to terminal Vdata, a second conduction node (the drain or the source in the present example) connected to an intermediate node a1 of the chip, and a control node (the gate in the present example) connected to terminal Vsel. Capacitive element 135 has a first electrode connected to node a1 and a second electrode connected to terminal Vp. Transistor 133 has a first conduction node connected to terminal Vp, a second conduction node connected to the anode of LED 120, and a control node connected to node a1. The cathode of LED 120 is connected to terminal Vn.

In elementary chip 110, transistor 131 is used in switched-mode (on or off) to allow or not the update of the LED brightness setting. Transistor 133 operates in linear mode to control the intensity of the current injected into the LED.

The operation of elementary chip 110 during a phase of update of the pixel brightness level is the following. Transistor 131 is turned on (made conductive) by the application of an adapted control signal to terminal Vsel. Capacitive element 135 then charges to a voltage level which is a function of the setting signal applied to terminal Vdata of the chip. The level of adjustment signal Vdata sets the potential of node a1, and accordingly the intensity of the current injected into the LED by transistor 133, and thus the light intensity emitted by the LED. Transistor 131 can then be turned back off. Node a1 then remains at a potential substantially equal to potential Vdata. Thus, the current injected into the LED remains substantially constant after the turning back off of transistor 131, and this, until the next update of the potential of node a1.

In practice, a display device may comprise a plurality of identical or similar elementary chips 110 assembled on a same transfer substrate according to a layout in an array of rows and columns, the chips being connected to elements of electric connection of the substrate for the control thereof, and each chip corresponding to a pixel of the display device.

As an example, the pixels of the display device are simultaneously controllable row by row. In other words, for each row of the array, the chips of the row have their control terminals Vsel connected to a same conductive track for controlling a row of the transfer substrate, the chips of different rows having their control terminals Vsel connected to different conductive tracks for controlling a row of the transfer substrate. Further, for each column of the array, the chips in the column have their control terminals Vdata connected to a same conductive track for controlling a column of the transfer substrate, the chips of different columns having their control terminals Vdata connected to different conductive tracks for controlling a column of the transfer substrate. During the display of an image, the pixels of the device may thus be simultaneously refreshed row by row.

To form a color image display device, a possibility is to provide, for each pixel of the device, a plurality of neighboring elementary chips capable of emitting in different wavelength ranges, for example, three elementary chips capable of respectively emitting red light, green light, and blue light. Each elementary chip then corresponds to a sub-pixel of the device. The elementary chips of different colors may comprise LEDs of different natures capable of emitting in different wavelength ranges, or LEDs of same nature topped with filters or with photoluminescent conversion elements of different natures.

A problem which arises then lies in the number and the density of the electric connection elements which should be provided on the transfer substrate to enable to individually control each sub-pixel of the device.

To limit the number of electric connection elements of the transfer substrate, a possibility is to integrate on a same elementary chip the different sub-pixels of a same pixel of the device.

Figure 2:
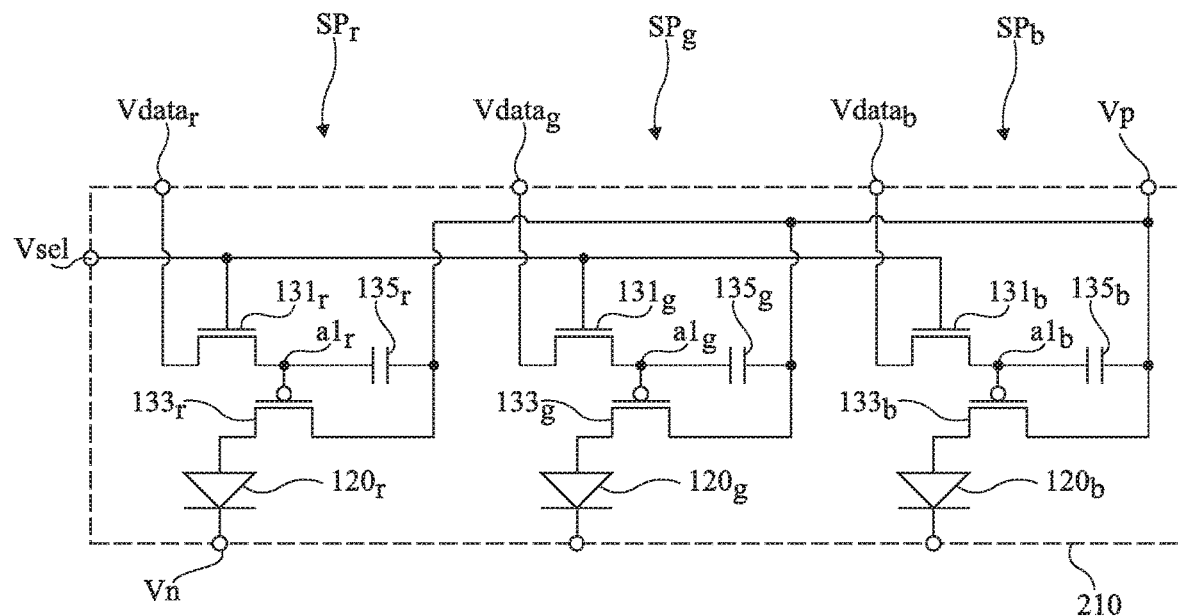
FIG. 2 is an electric diagram of the circuits of an elementary chip of another example of an image display device.

FIG. 2 is an electric diagram of an elementary chip 210 of a display device where each elementary chip corresponds to a pixel of the device and integrates three sub-pixels $SP_r$, $SP_g$ and $SP_b$ capable of respectively emitting red light, green light, and blue light.

Each sub-pixel $SP_r$, $SP_g$, and $SP_b$ of chip 210 substantially comprises the same circuit elements as chip 110 of FIG. 1, that is, a LED $120_r$, respectively $120_g$, respectively $120_b$, a selection transistor $131_r$, respectively $131_g$, respectively $131_b$, a current adjustment transistor $133_r$, respectively $133_g$, respectively $133_b$, and a capacitive element $135_r$, respectively $135_g$, respectively $135_b$.

In this example, the chip comprises six terminals of connection to the outside Vp, Vn, Vsel, $Vdata_r$, $Vdata_g$, and $Vdata_b$. Terminals Vp and Vn are intended to respectively receive the low and high power supply potentials Vp and Vn of the chip. Terminals Vsel, $Vdata_r$, $Vdata_g$, and $Vdata_b$ are intended to receive chip control signals. More particularly, signal Vsel is a chip selection signal, and signals $Vdata_r$, $Vdata_g$, and $Vdata_b$ are signals for individually setting the brightness levels of LEDs $120_r$, $120_g$, and $120_b$ respectively.

Each of transistors $131_r$, $131_g$, and $131_b$ has its control node connected to terminal Vsel. Transistor $131_r$ has a first conduction node connected to terminal $Vdata_r$ and a second conduction node connected to an intermediate node $a1_r$ of the chip, transistor $131_g$ has a first conduction node connected to terminal $Vdata_g$ and a second conduction node connected to an intermediate node $a1_g$ of the chip, and transistor $131_b$ has a first conduction node connected to terminal $Vdata_b$ and a second conduction node connected to an intermediate node $a1_b$ of the chip. Capacitive element $135_r$ has a first electrode connected to node $a1_r$ and a second electrode connected to terminal Vp, capacitive $135_g$ has a first electrode connected to node $a1_g$ and a second electrode connected to terminal Vp, and capacitive element $135_b$ has a first electrode connected to node $a1_b$ and a second electrode connected to terminal Vp. Transistor $133_r$ has a first conduction node connected to terminal Vp, a second conduction node connected to the anode of LED $120_r$, and a control node connected to node $a1_r$, transistor $133_g$ has a first conduction node connected to terminal Vp, a second conduction node connected to the anode of LED $120_g$, and a control node connected to node $a1_g$, and transistor $133_b$ has a first conduction node connected to terminal Vp, a second conduction node connected to the anode of LED $120_b$, and a control node connected to node $a1_b$. Each of LEDs $120_r$, $120_g$, $120_b$ has its cathode connected to terminal Vn.

LEDs $120_r$, $120_g$, and $120_b$ are for example LEDs of different natures capable of emitting light in different wavelength ranges. As a variation, LEDs $120_r$, $120_g$, and $120_b$ are of same nature and emit in the same wavelength range, but are topped with filters or photoluminescent conversion elements of different natures so that pixels $SP_r$, $SP_g$, and $SP_b$ emit in different wavelength ranges.

The operation of elementary chip 210 is for example similar to what has been described in relation with FIG. 1, with the difference that, in the example of FIG. 2, on selection of elementary chip 210 by application of an adapted control signal on terminal Vsel, the potentials of nodes $a1_r$, $a1_g$ and $a1_b$ are simultaneously updated according to the potentials applied to terminals $Vdata_r$, $Vdata_g$, and $Vdata_b$ respectively, which results in simultaneously updating the individual brightness settings of LEDs $120_r$, $120_g$, and $120_b$.

A disadvantage of the display device of FIG. 2 is that the number of electric connection elements to be provided on the transfer substrate to enable to individually control each pixel of the device remains relatively high, particularly due to the fact that the brightness setting signals $Vdata_r$, $Vdata_g$, and $Vdata_b$ are supported by different conductive tracks of the transfer substrate.

According to an aspect of an embodiment, it is provided to form a display device where each elementary chip integrates a plurality of individually controllable sub-pixels, but where, in each elementary chip, a single terminal of connection to the outside is provided to receive the individual signals for setting the brightness of the different chip sub-pixels, the individual signals for setting the brightness of the sub-pixels being temporally multiplexed on this connection terminal.

Figure 3:
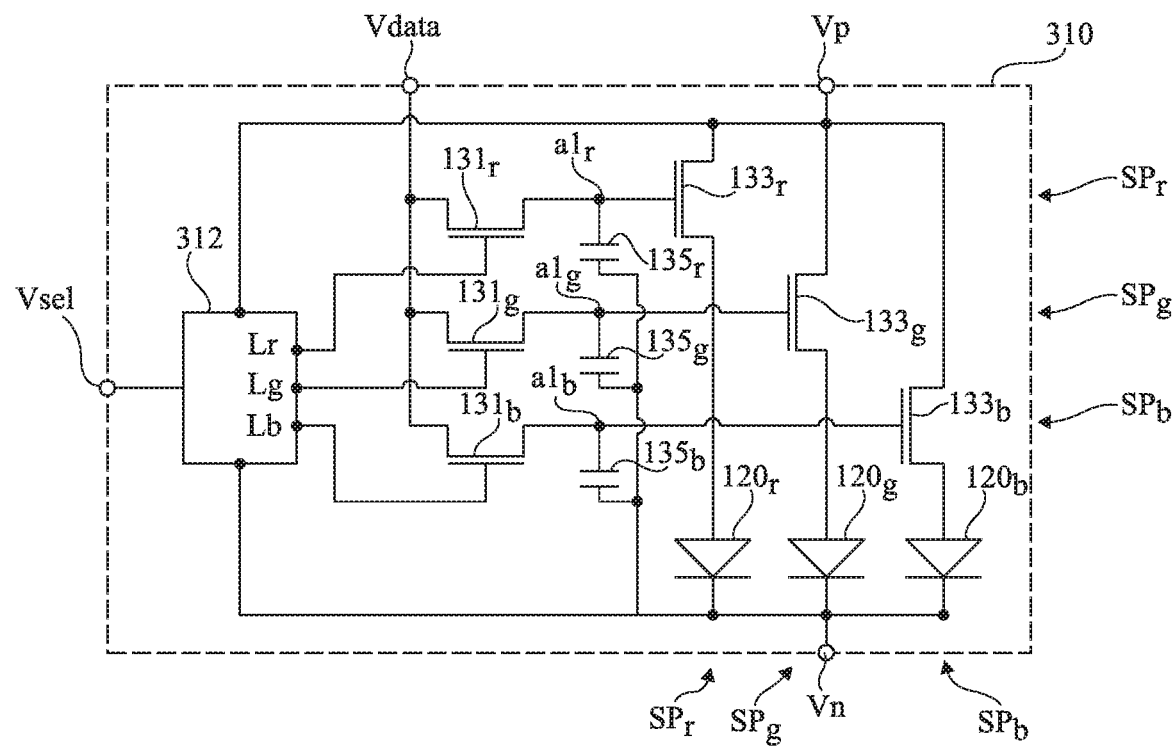
FIG. 3 is a simplified electric diagram of the circuits of an elementary chip of an example of an image display device according to an embodiment.

FIG. 3 is a simplified electric diagram of the circuits of an elementary chip 310 of an example of an image display device according to an embodiment.

As in the example of FIG. 2, each elementary chip 310 corresponds to a pixel of the device and integrates three sub-pixels $SP_r$, $SP_g$, and $SP_b$ capable of respectively emitting red light, green light, and blue light.

Each sub-pixel $SP_r$, $SP_g$, and $SP_b$ of chip 310 substantially comprises the same circuit elements as in the example of FIG. 2, that is, a LED $120_r$, respectively $120_g$, respectively $120_b$, a selection transistor $131_r$, respectively $131_g$, respectively $131_b$, a current adjustment transistor $133_r$, respectively $133_g$, respectively $133_b$, and a capacitive element $135_r$, respectively $135_g$, respectively $135_b$. In the shown example, transistors $131_r$, $131_g$, $131_b$, $133_r$, $133_g$, $133_b$ are N-channel MOS transistors.

In this example, the chip comprises four terminals of connection to the outside Vp, Vn, Vsel, and Vdata. Terminals Vp and Vn are intended to respectively receive a low power supply potential Vp and a high power supply potential Vn of the chip. Terminals Vsel and Vdata are intended to receive chip control signals. More particularly, terminal Vsel is intended to receive a chip selection signal, and terminal Vdata is intended to receive individual signals for setting the brightness levels of LEDs $120_r$, $120_g$, $120_b$, temporally multiplexed.

Chip 310 further comprises an internal selection circuit 312 receiving signal Vsel and delivering selection signals Lr, Lg, and Lb respectively applied to the gates of transistors $131_r$, $131_g$, and $131_b$. More particularly, in the shown example, circuit 312 comprises three output nodes Lr, Lg, and Lb respectively connected to the gates of transistors $131_r$, $131_g$, and $131_b$. Circuit 312 is further coupled to terminals Vp and Vn of the chip for its power supply.

Transistor $131_r$ has a first conduction node connected to terminal Vdata and a second conduction node connected to an intermediate node $a1_r$ of the chip, transistor $131_g$ has a first conduction node connected to terminal Vdata and a second conduction node connected to an intermediate node $a1_g$ of the chip, and transistor $131_b$ has a first conduction node connected to terminal Vdata and a second conduction node connected to an intermediate node $a1_b$ of the chip. Capacitive element $135_r$ has a first electrode connected to node $a1_r$ and a second electrode connected to terminal Vn, capacitive element $135_g$ has a first electrode connected to node $a1_g$ and a second electrode connected to terminal Vn, and capacitive element $135_b$ has a first electrode connected to node $a1_b$ and a second electrode connected to terminal Vn. Transistor $133_r$ has a first conduction node connected to terminal Vp, a second conduction node connected to the anode of LED $120_r$, and a control node connected to node $a1_r$, transistor $133_g$ has a first conduction node connected to terminal Vp, a second conduction node connected to the anode of LED $120_g$, and a control node connected to node $a1_g$, and transistor $133_b$ has a first conduction node connected to terminal Vp, a second conduction node connected to the anode of LED $120b$, and a control node connected to node $a1_b$. Each of LEDs $120_r$, $120_g$, $120_b$ has its cathode connected to terminal Vn.

Figure 4:
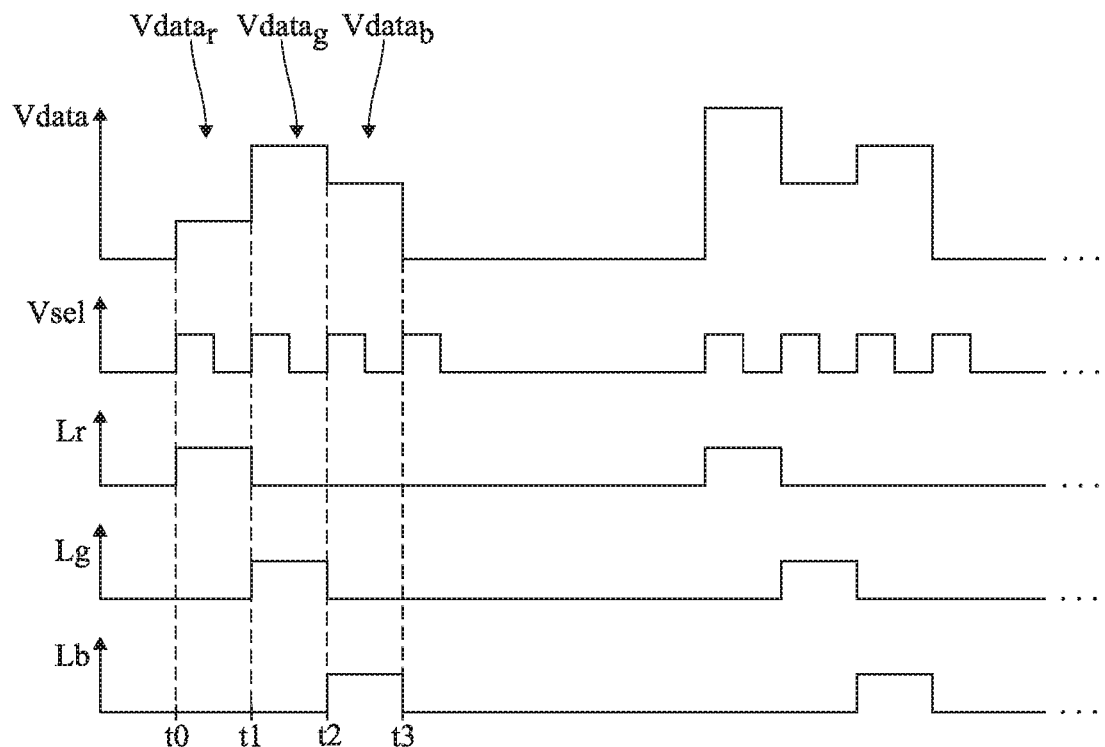
FIG. 4 is a timing diagram illustrating an example of an operating mode of the elementary chip of FIG. 3.

FIG. 4 is a timing diagram illustrating an example of an operating mode of elementary chip 310 of FIG. 3. More particularly, FIG. 4 shows the variation, over time, of signals Vdata, Vsel, Lr, Lg, and Lb of chip 310 during a phase of update of the individual brightness levels of sub-pixels $SP_r$, $SP_g$ and $SP_b$ of the chip.

To control the update of the individual brightness levels of the sub-pixels SPr, SPg, and SPb of the chip, a pulse train is applied to terminal Vsel of the chip. More particularly, in this example, the pulse train comprises nbSP+1 pulses, for example, regularly spaced apart in time, where nbSP is the number of sub-pixels of the chip (nbSP=3 in the present example). The rising edge of the first pulse of the pulse train marks the beginning of the pixel update phase, and the rising edge of the last pulse of the pulse train marks the end of the pixel update phase.

At a time t0 of beginning of the pixel update phase, corresponding to the rising edge of the first pulse of signal Vsel, internal selection circuit 312 orders the turning on of selection transistor 131r of sub-pixel SPr, and the maintaining in the off state of selection transistors 131g and 131b of sub-pixels SPg and SPb. For this purpose, in this example, at time t0, signal Lr is set to a high state and signals Lg and Lb are set to a low state.

Between time t0 and a time t1 corresponding to the rising edge of the second pulse of signal Vsel, capacitor $135_r$ of pixel $SP_r$ charge to a voltage level which is a function of the potential applied to terminal Vdata between times t0 and t1, while the voltage levels of capacitors $135_g$ and $135_b$ remain substantially unchanged.

At time t1, inner selection circuit 312 orders the turning off of selection transistor $131_r$ of sub-pixel $SP_r$, the turning on of selection transistor $131_g$ of sub-pixel $SP_g$, and the maintaining in the off state of selection transistor $131_b$ of sub-pixel $SP_b$. For this purpose, in the present example, at time t1, signal Lr is set to the low state, signal Lg is set to the high state, and signal Lb is maintained in the low state.

Between time t1 and a time t2 corresponding to the rising edge of the third pulse of signal Vsel, the capacitor $135_g$ of pixel $SP_g$ charges to a voltage level which is a function of the potential applied to terminal Vdata between times t1 and t2, while the voltage levels of capacitors $135_r$ and $135_b$ remain substantially unchanged.

At time t2, inner selection circuit 312 controls the turning off of selection transistor $131_g$ of sub-pixel $SP_g$, the turning on of selection transistor $131_b$ of sub-pixel $SP_b$, and the maintaining in the off state of selection transistor $131_r$ of sub-pixel $SP_r$. For this purpose, in the present example, at time t2, signal Lg is set to the low state, signal Lb is set to the high state, and signal Lr is maintained in the low state.

Between time t2 and a time t3 corresponding to the rising edge of the third pulse of signal Vsel, capacitor $135_b$ of pixel $SP_b$ charges to a voltage level which is a function of the potential applied to terminal Vdata between times t2 and t3, while the voltage levels of capacitors $135_r$ and $135_g$ remain substantially unchanged.

Time t3 marks the end of the pixel update phase. From time t3, the brightness levels of LEDs $120_r$, $120_g$, and $120_b$ remain substantially unchanged until the next update of the pixel.

As can be seen in FIG. 4, in this example, the level of signal Vdata varies between times t0 and t3, in stages, at each new rising edge of signal Vsel. The portion of signal Vdata between times t0 and t1 corresponds to an individual signal for setting LED $120_r$ of sub-pixel $SP_r$, the portion of signal Vdata between times t1 and t2 corresponds to an individual signal for setting LED $120_g$ of sub-pixel $SP_g$, and the portion of signal Vdata between times t2 and t3 corresponds to an individual signal for setting LED $120_g$ of sub-pixel $SP_g$. Individual setting signals $Vdata_r$, $Vdata_g$ and $Vdata_b$ are thus temporally multiplexed on terminal Vdata. The assembly comprising internal selection circuit 312, transistors $131_r$, $131_g$, $131_b$, $133_r$, $133_g$, $133_b$ and capacitors $135_r$, $135_g$, and $135_b$ of the chip forms a control circuit capable of demultiplexing the individual setting signals received on terminal Vdata, and of applying to each LED of the chip a bias signal (a current in the present example) which is a function of the individual LED setting signal.

It should be noted that the forming of internal selection circuit 312 of the chip, capable of implementing the operation described in relation with FIG. 4, has not been detailed, the forming of such a circuit being within the abilities of those skilled in the art based on the functional indications of the present disclosure. As an example, circuit 312 may comprise a two-stage pulse counter associated with decoding gates, and with a reset mechanism, for example, obtained by an assembly of envelope detector type receiving signal Vsel as an input.

Similarly to what has been described in relation with FIG. 1, the elementary chips 310 of the display device of FIG. 3 may be arranged in an array of rows and columns and be interconnected in rows and columns to allow a simultaneous control, row by row, of the device pixels.

An advantage of the embodiment described in relation with FIG. 3 is that each elementary chip 310 comprises a single terminal Vdata to receive the individual signals for setting all the chip sub-pixels. Thus, in the example of FIG. 3, each elementary chip 310 only comprises four terminals of connection to the outside, that is, no more than in an elementary chip of the type described in relation with FIG. 1 (comprising a single LED). This enables, in particular, as compared with the example of FIG. 2, to decrease the number of electric connection elements to be provided on the transfer substrate. Indeed, in the embodiment of FIG. 3, the individual signals Vdata$_r$, Vdata$_g$, and Vdata$_b$ for setting the brightness of the different sub-pixels of a same chip 310 are supported by a same conductive track of the transfer substrate.

It should be noted that the described embodiments are not limited to the specific example described in relation with FIG. 3, where each elementary chip comprises a single pixel divided into three sub-pixels capable of emitting in three different wavelength ranges. As a variation, each elementary chip may comprise a single pixel divided into a number of sub-pixels different from three. In another variation, each elementary chip may comprise a plurality of pixels divided or not into sub-pixels of different colors.

In particular, as will be explained in further detail hereafter, the described embodiments are particularly adapted to the forming of a so-called multi-view display device, that is, where the image to be displayed is divided into macropixels, each comprising a plurality of pixels corresponding to different views of the scene which is desired to be copied. As an example, the different pixels of a same macropixel respectively correspond to a same pixel of different images of a same scene, taken under different viewing angles. A multi-view display device may for example be used in applications where it is desired to give the user an impression of three-dimensional viewing.

Figure 5:
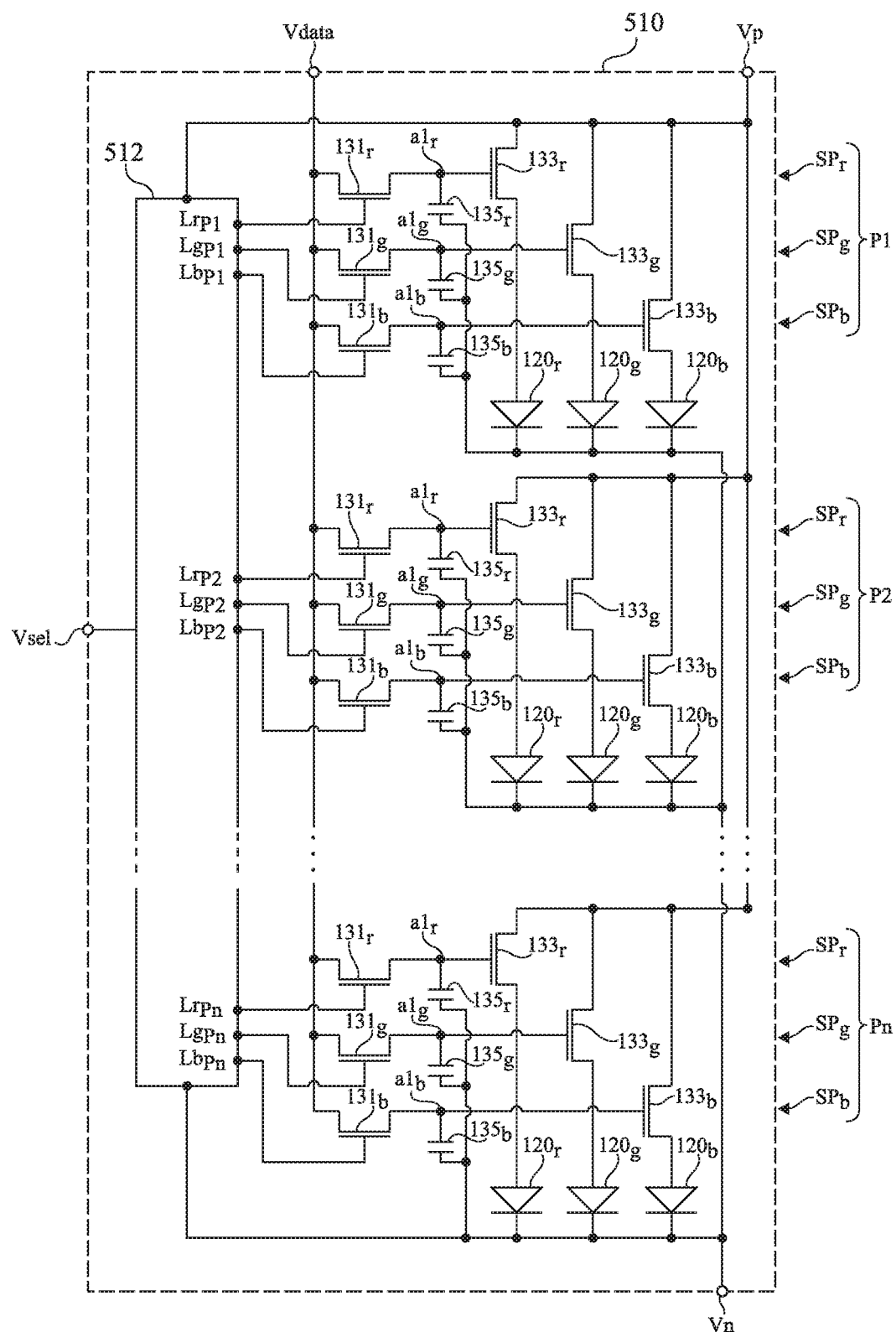
FIG. 5 is a simplified electric diagram of the circuits of an elementary chip of another example of an image display device according to an embodiment.

FIG. 5 is a simplified electric diagram of the circuits of an elementary chip 510 of an example of a multi-view image display device according to an embodiment.

In this example, each elementary chip 510 corresponds to a macropixel of the device, comprising n pixel P1, P2, . . . Pn intended to respectively display a same point of n different images, for example corresponding to n different views of a same scene, where n is an integer greater than 1, for example, in the range from 2 to 50. In the present example, each pixel Pi of the macropixel, i being an integer from 1 to n, comprises a plurality of sub-pixels capable of emitting in different wavelength ranges, to allow the display of color images. More particularly, in the shown example, each pixel Pi comprises three sub-pixels SP$_r$, SP$_g$ and SP$_b$ capable of respectively emitting red light, green light, and blue light. As in the example of FIG. 3, the chip 510 of FIG. 5 comprises four terminals of connection to the outside Vp, Vn, Vsel, and Vdata. Each sub-pixel SP$_r$, SP$_g$, SP$_b$ of chip 510 comprises substantially the same circuit elements as in the example of FIG. 3, arranged substantially in the same way. In the example of FIG. 5, the selection transistors 131$_r$, 131$_g$, 131$_b$ of all the pixels P1, P2, . . . Pn of chip 510 (that is, n*3 selection transistors) have their first conduction node connected to the same terminal Vdata of the chip.

Chip 510 further comprises an internal selection circuit 512 similar to circuit 312 of FIG. 3, receiving signal Vsel and delivering, for each pixel Pi, selection signals Lr$_{Pi}$, Lg$_{Pi}$, and Lb$_{Pi}$ respectively applied to the gates of transistors 131$_r$, 131$_g$, and 131$_b$ of pixel Pi. In other words, circuit 512 comprises n*3 output nodes Lr$_{P1}$, Lg$_{P1}$, Lb$_{P1}$, Lr$_{P2}$, Lg$_{P2}$, Lb$_{P2}$, . . . Lr$_{Pn}$, Lg$_{Pn}$, Lb$_{Pn}$ respectively connected to the gates of selection transistors 131$_r$, 131$_g$, and 131$_b$ of the n pixels Pi of the chip. Circuit 512 is further coupled to terminals Vp and Vn of the chip for its power supply.

The operation of elementary chip 510 of FIG. 5 is similar to what has been described hereabove in relation with FIGS. 3 and 4. More particularly, in the example of FIG. 5, during a phase of update of the n*3 sub-pixels of the chip, the n*3 individual signals for setting the n*3 LEDs of the chip are temporally multiplexed on terminal Vdata of the chip. Selection signal Vsel for example comprises a train of (n*3)+1 pulses to synchronize the demultiplexing of signal Vdata inside of the chip.

Similarly to what has been previously described, the elementary chips 510 of the display device of FIG. 5 may be arranged in an array of rows and columns, and interconnected in rows and in columns to allow a simultaneous control, row by row, of the macropixels of the device.

It should be noted that when the number of LEDs to be individually controlled in each elementary chip of the device is high, it may be advantageous to transmit the individual signals for setting the different LEDs of the chip in the form of serialized digital data on connection terminal Vdata of the chip, particularly to be able to perform a faster transfer of the setting signals.

Figure 6:
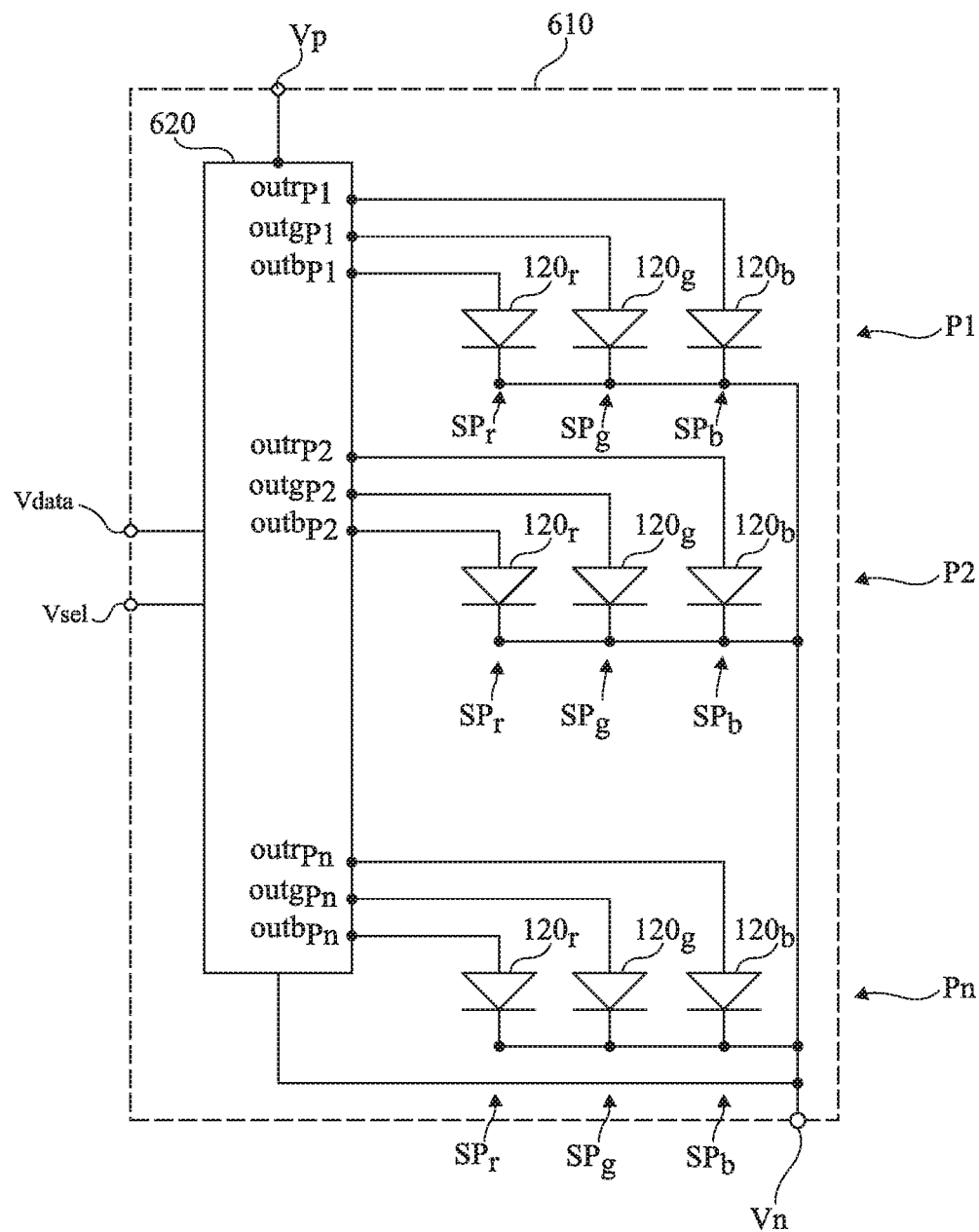
FIG. 6 is a simplified electric diagram of the circuits of an elementary chip of another example of an image display device according to an embodiment.

FIG. 6 is a simplified electric diagram of the circuits of an elementary chip 610 of an example of a multi-view image display device according to an embodiment. Chip 610 of FIG. 6 differs from chip 510 of FIG. 5 mainly in that, in chip 610, the individual signals for setting the different LEDs of the chip are received in the form of serialized digital data on connection terminal Vdata of the chip.

As in the example of FIG. 5, the elementary chip 610 of FIG. 6 corresponds to a macropixel of the display device, comprising n pixels P1, P2, . . . Pn, each comprising three sub-pixels SP$_r$, SP$_g$, and SP$_b$, each comprising an individually settable LED. In this example, each sub-pixel SP$_r$ comprises a LED 120$_r$ arranged to emit red light, each sub-pixel SP$_g$ comprises a LED 120$_g$ arranged to emit green light, and each sub-pixel SP$_b$ comprises a LED 120$_b$ arranged to emit blue light. In this example, all the LEDs of the chip have their cathode region connected to the low power supply potential Vn of the chip.

In the example of FIG. 6, chip 610 further comprises a control circuit 620 connected to the terminals of connection to the outside Vsel, Vdata, Vp, and Vn of the chip. Circuit 620 is capable of decoding the serialized digital signal received by the chip on its terminal Vdata, and of applying to each LED of the chip a bias signal which is a function of the individual LED setting signal received in digital form on terminal Vdata. For this purpose, circuit 620 comprises n*3 output nodes or bias signal supply nodes, respectively coupled to the anode contact regions of the n*3 LEDs of the chip. More particularly, circuit 620 comprises, for each pixel Pi of the chip, an output node outr$_{Pi}$ coupled to the anode of LED 120$_r$ of pixel Pi, an output node outg$_{Pi}$ coupled to the anode of LED 120$_g$ of pixel Pi, and an output node outb$_{Pi}$ coupled to the anode of LED 120$_b$ of pixel Pi. Circuit 620 is for example capable of supplying each LED of the chip, via its output node connected to the anode of the LED, with a bias current which is a function of the individual LED setting signal received on terminal Vdata of the chip. In the example of FIG. 6, control circuit 620 replaces the control circuit formed by internal selection circuit 512, transistors 131$_r$, 131$_g$, 131$_b$, 133$_r$, 133$_g$, 133$_b$ and capacitors 135$_r$, 135$_g$, and 135$_b$ in the example of FIG. 5.

FIGS. 7 and 8 are timing diagrams illustrating an example of an operating mode of elementary chip 610 of FIG. 6. More particularly, FIG. 7 partially shows the signal applied to terminal Vsel of the chip during a phase of update of the individual brightness levels of the sub-pixels of the chip. FIG. 8 shows the variation of signals CLK and SYNC internal to the chip generated by circuit 620 from signal Vsel. FIG. 8 further shows the variation of signal Vdata applied to the chip during a phase of update of the individual brightness levels of the chip sub-pixels.

In this example, signal Vsel is a signal with three levels, a low level (0), an intermediate level $TH_{CLK}$ higher than the low level, and a high level $TH_{SYNC}$ higher than the intermediate level. Signal Vsel transmitted to chip 610 during a phase of update of the individual brightness levels of the chip sub-pixels corresponds to the superposition of a periodic clock signal CLK, corresponding to a succession of regularly spaced apart pulses of intermediate level $TH_{CLK}$ and of a synchronization signal SYNC, corresponding to a succession of pulses of high level $TH_{SYNC}$.

Control circuit 620 comprises a stage (not detailed) of separation of signals CLK and SYNC, receiving on an input node signal Vsel and delivering on two different output nodes two binary signals respectively corresponding to signal CLK and to signal SYNC. As an example, the separation of signals CLK and SYNC is performed by means of two comparators comparing signal Vsel respectively with threshold $TH_{CLK}$ and with threshold $TH_{SYNC}$, the comparator outputs respectively delivering signal CLK and signal SYNC.

Signal CLK is a clock signal enabling to rate the operations of decoding of the serialized digital signal transmitted on terminal Vdata, and signal SYNC is a synchronization signal enabling to indicate to control circuit 620 that it will receive data to be decoded on terminal Vdata of the chip.

In the example of FIG. 8, a chip 610 corresponding to a macropixel of n=5, pixels each comprising nbsP=3 sub-pixels, that is, 15 LEDs to be updated, is considered. Further, it is considered in this example that the individual signal for setting each LED of chip 610 is coded over nbits=4 bits. In practice, the number nbits of bits over which each individual LED setting signal is coded may be different from 4, for example, in the range from 4 to 16 bits.

In the present example, the macropixel update sequence starts with the application of a double pulse of signal SYNC to terminal Vsel.

On reception of this double pulse of signal SYNC, circuit 620 is informed that serialized macropixel update binary data will be transmitted on its terminal Vdata. A counter internal to circuit 620, rated by clock signal CLK, is for example reset at this step.

After the double pulse of signal SYNC, a train of n*nbits=5*4=20 data bits is transmitted to circuit 620 via terminal Vdata, corresponding to the individual signals for setting the n sub-pixels of a first color of the macropixel, for example, the n sub-pixels $Sp_r$ of the macropixel.

A simple pulse of signal SYNC is then applied to terminal Vsel. Circuit 620 is thus informed that a second train of n*nbits data bits will be transmitted thereto via terminal Vdata, corresponding to the individual signals for setting the n sub-pixels of a second color of the macropixel, for example, the n sub-pixels $SP_g$ of the macropixel.

After the transmission of the second train of n*nbits, a new simple pulse of signal SYNC is applied to terminal Vsel, to inform circuit 620 that a third train of n*nbits data bits will be transmitted thereto via terminal Vdata, corresponding to the individual signals for setting the n sub-pixels of a third color of the macropixel, for example, the n sub-pixels $SP_b$ of the macropixel.

It should be noted that the order in which the data are transmitted to circuit 620 is of no importance, provided for circuit 620 to know this order and to be adapted.

Further, although an example of implementation where the transmissions of the signals for setting the different macropixel colors are separated by pulses of single SYNC has been shown, the described embodiments are not limited to this specific case. As a variation, signal SYNC may comprise a single simple pulse at the beginning of the update phase, the data being then transmitted in the form of an uninterrupted train of n*nbSP*nbits bits, that is, 60 bits in the considered example.

For each individual macropixel LED setting signal, a digital-to-analog conversion of the individual setting signal received on terminal Vdata may be implemented. A bias signal (current or voltage) which is a function of the received setting signal is then applied to the LED. As an example, for each LED of chip 610, circuit 620 comprises a digital-to-analog converter, that is, a total of n*nbSP digital-to-analog converters. The analog output signal of the digital-to-analog converter associated with a LED is for example directly applied to the anode of the LED. As a variation, the output signal of the digital-to-analog converter is used to set a controllable current source injecting a current into the LED.

Similarly to what has been previously described, the elementary chips 610 of the display device of FIG. 6 may be arranged in an array of rows and columns, and interconnected in rows and in columns to allow a simultaneous control, row by row, of the macropixels of the device.

It should be noted that the examples of FIGS. 5 and 6 may be adapted to the case where the pixels P1, P2, . . . Pn of each elementary chip 510 or 610 of the device are monochromatic pixels of the type described in relation with FIG. 1, that is, not divided into sub-pixels capable of emitting in different wavelength ranges.

Further, the variation of FIG. 6 (digital transmission of the setting signals) may be adapted to the case where elementary chip 610 comprises, as in the example of FIG. 3, a single pixel divided into a plurality of sub-pixels capable of emitting in different wavelength ranges.

FIGS. 9A, 9B, and 9C are simplified views of an elementary chip of an image display device of the above-described type. In this example, the chip comprises 6 pixels P1, P2, P3, P4, P5, and P6, each comprising three sub-pixels $SP_r$, $SP_g$, and $SP_b$ capable of emitting in three different wavelength ranges.

FIG. 9A is a top view of the chip, FIG. 9B is a cross-section view of the chip along plane 9B-9B of FIG. 9A, and FIG. 9C is a bottom view of the chip.

As shown in FIG. 9B, the chip comprises a first substrate 901, for example, based on a III-V semiconductor, having LEDs $120_r$, $120_g$, $120_b$ of the chip formed therein and, adjacent and electrically connected to substrate 901, a second substrate 903, for example, made of silicon, having the chip control circuit formed therein.

As shown in FIG. 9C, the chip comprises, on the side of the surface of substrate 903 opposite to substrate 901, an electric connection area 905 comprising the four terminals of connection to the outside Vp, Vn, Vsel, and Vdata of the chip.

It should be noted that in the shown example, as can be seen in FIG. 9A, the pixels P1, P2, . . . Pn of the chip are arranged in a linear array, aligned along an axis x. The elementary chips are assembled on the transfer substrate of the device according to an array layout in rows and columns, so that the axis x of each chip is substantially parallel to the array rows. Indeed, in a multi-view display device, it is generally desired for the user to be able to perceive different views of the scene when the observer's eye displaces along a direction parallel to the axis of the array rows (generally a horizontal direction), and not when it displaces along a direction parallel to the axis of the columns (generally a vertical direction). In practice, each macropixel is topped with one or a plurality of lenses, not shown, capable of performing the angular separation, along axis x, of the beams corresponding to the different pixels of the macropixel.

In the shown example, in each pixel Pi, the sub-pixels $SP_r$, $SP_g$, $SP_b$ of the pixel are arranged in a bar, aligned along an axis y substantially orthogonal to axis x, and substantially parallel to the columns of the macropixel array. An advantage of such a configuration is that it enables to avoid an angular separation of the different colors of a same pixel, due to the presence of the lens(es) of angular separation along axis x above the macropixel.

Figure 10:
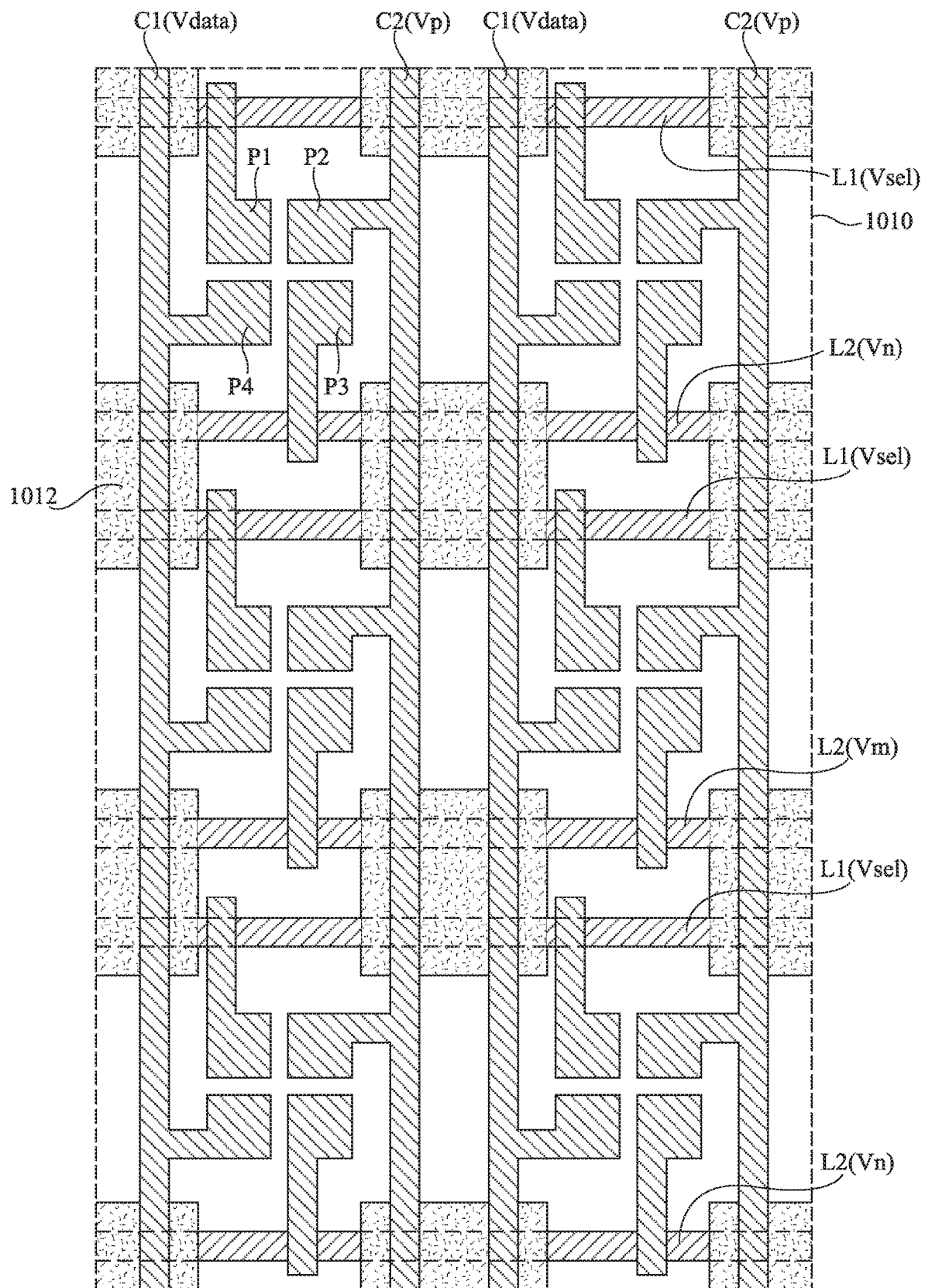
FIG. 10 is a top view of an example of a transfer substrate of an image display device according to an embodiment.

FIG. 10 is a simplified and partial top view of an example of a transfer substrate for the elementary chips of a display device of the type described hereabove in relation with FIGS. 3 to 8. In FIG. 10, only a portion of the transfer substrate, corresponding to a sub-array of three rows and two columns of the display device, has been shown.

The transfer substrate for example comprises a support plate or sheet 1010 made of an insulating material, for example, of glass or of plastic. The transfer substrate further comprises electric connection elements, and in particular conductive tracks and conductive areas, formed by printing on the upper surface of support plate 1010. The electric connection elements are formed by printing of a succession of conductive and insulating levels on the upper surface of support plate 1010. The electric connection elements are for example formed by a printing method of inkjet printing type, silk-screening, rotogravure, or by any other adapted method.

The transfer substrate of FIG. 10 is a passive substrate, that is, it only comprises electric connection elements. Active control circuits of the display device, capable of powering and controlling the elementary chips of the device via electric connection elements of the transfer substrate, are for example connected to the electric connection elements of the transfer substrate at the periphery of the transfer substrate.

In the shown example, the manufacturing of the transfer substrate comprises the following three printing successive steps.

During a first printing step, a plurality of conductive tracks substantially parallel to the direction of the rows of the display device is printed on the upper surface of support plate 1010. More particularly, in the present example, during the first printing step, two conductive tracks L1 and L2 extending along substantially the entire length of the rows of the display device are printed for each row of the display device. Tracks L1 are intended to convey the control signals Vsel of the different pixel or macropixel rows of the device. Tracks L2 are intended to distribute the low power supply potential Vn of the device. The conductive elements printed during the first printing steps define a first conductive level M1 of the transfer substrate.

During a second printing step, certain portions of conductive tracks L1 and L2 are covered with an insulating material 1012, to allow the subsequent printing of conductive tracks extending above tracks L1 and L2, without creating a short-circuit with tracks L1 and L2.

During a third printing step, a plurality of conductive tracks substantially parallel to the direction of the columns of the display device is printed on the upper surface of support plate 1010. More particularly, in the present example, during the third printing step, two conductive tracks C1 and C2 extending along substantially the entire height of the columns of the display device are printed for each column of the display device. Tracks C1 are intended to convey the signals Vdata for controlling the different pixel or macropixel columns of the device. Tracks C2 are intended to distribute the high power supply potential Vp of the device. Conductive tracks C1 and C2 are insulated from conductive tracks L1 and L2 by insulating regions 1012 formed at the previous step. During the third printing step, for each pixel or macropixel of the device, four conductive tracks P1, P2, P3, and P4 intended to respectively receive connection terminals Vsel, Vp, Vn, and Vdata of the chip comprising the pixel and the macropixel are further printed. Area P1 is connected to the conductive track L1 associated with the row containing the pixel or the macropixel. For this purpose, area P1 extends on top of and in contact with the upper surface of track L1 in an area of track L1 which is not coated with insulating material 1012. Area P2 is connected to the conductive track C2 associated with the column containing the pixel or the macropixel. For this purpose, area P2 is contiguous to conductive track C2. Area P3 is connected to the conductive track L2 associated with the row containing the pixel or the macropixel. For this purpose, area P3 extends on top of and in contact with the upper surface of track L2, in an area of track L2 which is not coated with insulating material 1012. Area P4 is connected to the conductive track C1 associated with the column containing the pixel or the macropixel. For this purpose, area P4 is contiguous to conductive track C1. The conductive tracks and areas printed during the third step define a second conductive level M2 of the transfer substrate. During the third printing step, alignment patterns for the chip transfer may further be printed in second conductive level M2.

An advantage of the transfer substrate described in relation with FIG. 10 is that all the conductive areas of connection of the transfer substrate to the elementary chips of the display device (areas P1, P2, P3, and P4) are formed in a same conductive level, during a same printing step. As a result, the areas P1, P2, P3, and P4 associated with a same pixel or macropixel of the device may be formed very close to one another, for example, distant two by two by less than 20 µm, preferably distant two by two by less than 10 µm, preferably distant two by two by less than 5 µm, which would be difficult or even impossible to obtain if conducive areas P1 and P3 were formed during the first printing step and if conductive areas P2 and P4 were formed during the third printing step. Indeed, the printing resolution of the conductive patterns during a same printing step is relatively high, while there may exist a relatively significant misalignment between conductive patterns formed during different printing steps.

Thus, the embodiment of FIG. 10 enables to maximize the conductive surface occupied by areas P1, P2, P3, P4 in the areas of connection of the substrate to the elementary chips, which enables to ease the subsequent step of assembly of the elementary chips on the transfer substrate, especially by loosening the alignment constraints of the chips relative to the transfer substrate.

It should be noted that the transfer substrate described in relation with FIG. 10 may be used not only in a display device of the type described in relation with FIGS. 3 to 8, where each elementary chip of the device comprises a plurality of individually settable LEDs, but also in a display device of the type described in relation with FIG. 1 where each elementary chip of the device comprises a single LED.

Further, although only embodiments where each elementary chip of the display device comprises four terminals of connection to the outside, the transfer substrate described in relation with FIG. 10 may be adapted to a display device where each elementary chip comprises a number of terminals of connection to the outside different from four. Thus, according to a more general definition of the embodiment of FIG. 10, it is provided to form elements of electric connection of the transfer substrate by printing on at least two successive conductive levels, and to form all the conductive areas of connection of the transfer substrate to the elementary chips of the display device in the last printed conductive level, it being understood that, for each elementary chip, the number of conductive areas of connection of the transfer substrate to the chip is greater than or equal to 2, and preferably greater than or equal to 3.

Specific embodiments have been described. Various alterations, modifications, and improvements will occur to those skilled in the art. In particular, the described embodiments are not limited to the examples of materials and/or of dimensions mentioned as an example in the present description.

What is claimed is:

1. An emissive display device comprising:
    a transfer substrate comprising electric connection elements; and
    a plurality of semiconductor chips fastened to the transfer substrate and connected to the elements of electric connection of the transfer substrate for the control thereof, each chip comprising:
        at least one LED;
        a plurality of terminals of connection to the transfer substrate; and
        a control circuit based on transistors capable of applying to said at least one LED a bias signal according to signals received on the terminals of connection of the chip to the transfer substrate,
    wherein the transfer substrate comprises an insulating plate, the electric connection elements of the transfer substrate being formed by printing, on a surface of said plate, of a first conductive level, followed by an insulating level, followed by a second conductive level, the elements of electric connection of the transfer substrate comprising:
    a plurality of first conductive tracks formed in the first conductive level;
    a plurality of second conductive tracks formed in the second conductive level; and
    for each chip of the device, a plurality of electric connection areas respectively connected to the connection terminals of the chip, said areas being all formed in the second conductive level;
    and wherein, in each elementary chip of the device, said at least one LED of the chip is formed in a first substrate based on a III-V semiconductor and has anode and cathode electric contacts on the side of a first surface of the first substrate, and wherein the chip control circuit is formed in a second substrate based on silicon and has electric connection areas on the side of a first surface of the second substrate, the first surface of the second substrate being adjacent to the first surface of the first substrate to directly place in contact the anode and cathode contacts of the LED with the electric connection areas of the control circuit, the connection terminals of the chip being formed on the side of a second surface of the second substrate opposite to the first surface of the second substrate.

2. The device of claim 1, wherein the first conductive tracks are substantially parallel and wherein the second conductive tracks are substantially orthogonal to the first tracks.

3. The device of claim 1, wherein each elementary chip is arranged so that the surface of its second substrate opposite to the first substrate faces the transfer substrate to form direct electric connections between the connection terminals of the chip and the electric connection areas of the transfer substrate.

4. The device of claim 1, wherein, for each chip of the device, the transfer substrate comprises at least one electric connection area connected to a first conductive track of the transfer substrate, and at least one electric connection area connected to a second conductive track of the transfer substrate.

5. The device of claim 1, wherein each elementary chip comprises a first terminal of connection to the transfer substrate intended to receive a signal for setting said at least one LED of the chip.

6. The device of claim 5, wherein each elementary chip further comprises a second terminal of connection to the transfer substrate intended to receive a selection and/or synchronization signal.

7. The device of claim 5, wherein each elementary chip further comprises third and fourth terminals of connection to the transfer substrate intended to respectively receive a high power supply potential and a low power supply potential of the chip.

8. The device of claim 5, wherein each elementary chip comprises a plurality of LEDs, and wherein the first connection terminal of the chip is intended to receive, for each LED of the chip, an individual signal for setting the LED, the individual signals for setting the different LEDs of the chip being temporally multiplexed on said first terminal.

9. The device of claim 8, wherein in each elementary chip, the chip control circuit is capable of demultiplexing the signals received on said first terminal and of applying to each LED of the chip a bias signal which is a function of the individual LED setting signal received on said first terminal.

10. A method of manufacturing the display device of claim 1, comprising the successive steps of:
    a) printing on said surface of the insulating plate the first conductive level to form said plurality of first conductive tracks;
    b) printing the insulating level on the first conductive level; and
    c) printing the second conductive level on the insulating level to form said plurality of electric connection areas.

11. The method of claim 10, wherein printing steps a), b), and c) are carried out by an inkjet printing, silk-screening or rotogravure method.

12. An emissive display device comprising:
    a transfer substrate comprising electric connection elements; and
    a plurality of semiconductor chips fastened to the transfer substrate and connected to the elements of electric connection of the transfer substrate for the control thereof, each chip comprising:
        at least one LED;
        a plurality of terminals of connection to the transfer substrate; and
        a control circuit based on transistors capable of applying to said at least one LED a bias signal according to signals received on the terminals of connection of the chip to the transfer substrate,
    wherein the transfer substrate comprises an insulating plate, the electric connection elements of the transfer substrate comprising, on a surface of said plate, a first conductive level, followed by an insulating level, followed by a second conductive level, the elements of electric connection of the transfer substrate comprising:
    a plurality of first conductive tracks formed in the first conductive level;

a plurality of second conductive tracks formed in the second conductive level; and for each chip of the device, a plurality of electric connection areas respectively connected to the connection terminals of the chip, said areas being all formed in the second conductive level, and wherein, in each elementary chip of the device, said at least one LED of the chip is formed in a first substrate based on a III-V semiconductor, and the chip control circuit is formed in a second substrate based on silicon and has electric connection areas on the side of a first surface of the second substrate, the first surface of the second substrate being adjacent to a first surface of the first substrate, the connection terminals of the chip being formed on the side of a second surface of the second substrate opposite to the first surface of the second substrate.

* * * * *